Dec. 28, 1965 T. A. CIENIEWICZ ETAL 3,226,255

MASKING METHOD FOR SEMICONDUCTOR

Filed Oct. 31, 1961

4 Sheets-Sheet 1

INVENTORS
I.L.CUSTMAN
T.A.CIENIEWICZ

By A. J. Nugent
ATTORNEY

MASKING METHOD FOR SEMICONDUCTOR

Filed Oct. 31, 1961 4 Sheets-Sheet 2

INVENTORS
I.L.CUSTMAN
T.A.CIENIEWICZ

BY A. J. Nugent
ATTORNEY

MASKING METHOD FOR SEMICONDUCTOR

Filed Oct. 31, 1961

INVENTORS
I. L. CUSTMAN
T. A. CIENIEWICZ
BY A. J. Nugent
ATTORNEY

INVENTORS
I.L.CUSTMAN
T.A.CIENIEWICZ
BY A. J. Nugent
ATTORNEY

④ United States Patent Office 3,226,255
Patented Dec. 28, 1965

1

3,226,255
MASKING METHOD FOR SEMICONDUCTOR

Theodore A. Cieniewicz, Reading, and Ira L. Custman, Jenkintown, Pa., assignors to Western Electric Company, Incorporated, a corporation of New York Filed Oct. 31, 1961, Ser. No. 149,121
5 Claims. (Cl. 117—212)

This invention relates to the fabrication of semiconductor devices and in particular to an improved method of masking a semiconductor slice preparatory to the etching thereof to form wafers.

In the fabrication of transistors, a plurality of transistor wafers are produced from a semiconductor slice by several methods. One of the methods generally employed to accomplish this comprises transferring a desired wafer pattern to the semiconductor slice and then acid etching the slice to produce the individual wafers. Prior to etching, however, it is necessary to mask that portion of the slice which is not to be etched. This is accomplished by coating the areas of the slice that are not to be etched with an acid-resist such as wax.

In prior art methods, the wax coating is usually applied by spraying the wax onto the slice through a mask containing a plurality of apertures. The difficulty with the spraying technique is that the wax mixture tends to run beneath the mask in a direction away from the apertures, the result being that portions of the semiconductor slice which should not have been protected are covered with wax. The effect of this is to render a great number of the wafers unusable and thus is quite costly.

It is, therefore, an object of this invention to provide an improved method of masking a semiconductor slice preparatory to the etching thereof whereby a plurality of wafers are produced.

A further object of this invention is to accomplish the masking by an extrusion method.

A method in accordance with the general features of this invention may comprise placing a mask having a plurality of apertures over the slice and extruding an acid resistant material, such as wax, through the mask and into adhering contact with the slice.

One example of the use of this method is to produce a plurality of mesa transistor wafers from a semiconductor slice. In this instance, each aperture in the mask would define a mesa and would in addition assure that only the mesa is covered with the acid-resist. Accordingly, when the slice is subsequently etched the areas surrounding each mesa will be removed leaving the mesa clearly and accurately defined.

The invention will be more readily understood from the detailed description which follows when read in conjunction with the drawings wherein.

Figures 1, 2, 3:
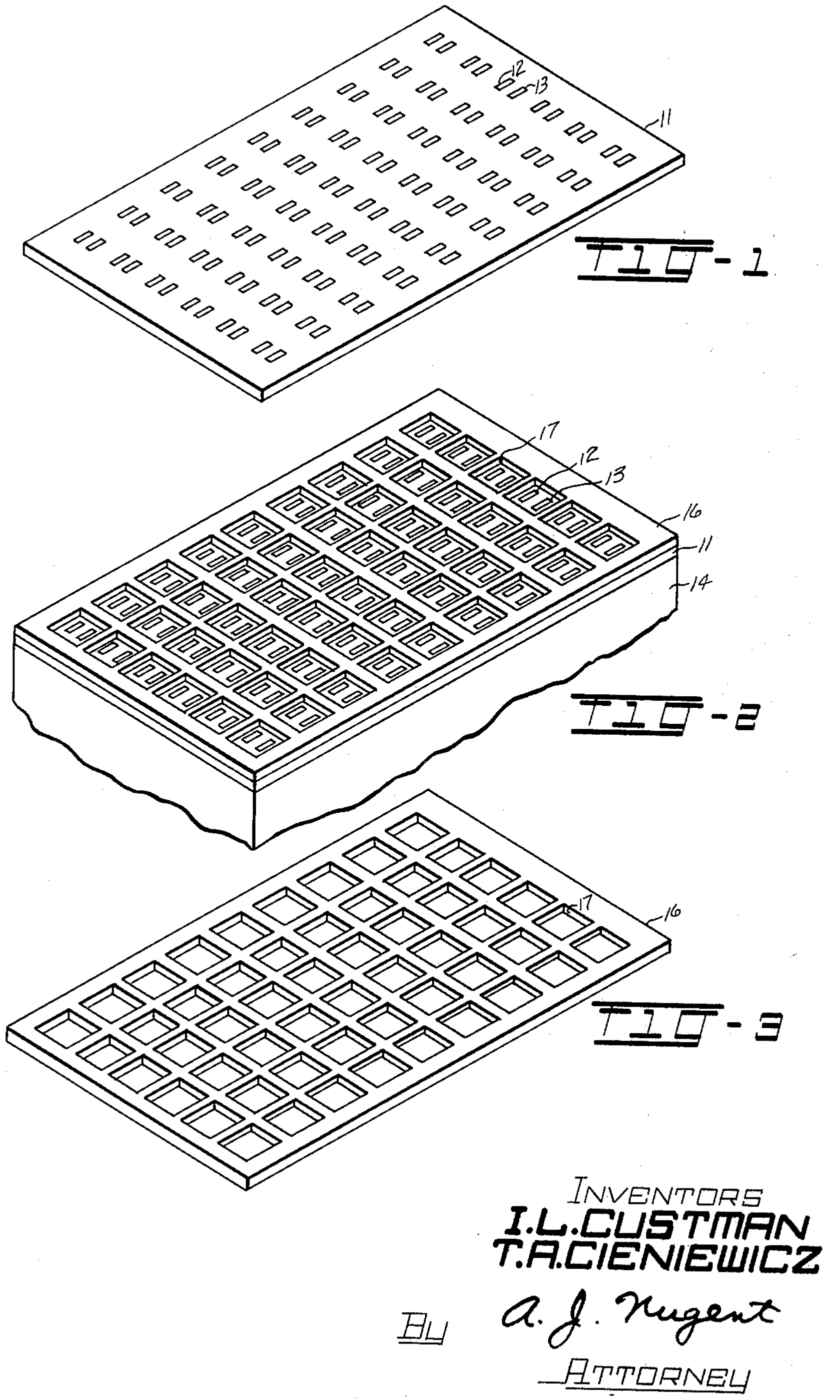
FIG. 1 shows a typical semiconductor slice having a plurality of contact stripes.
FIG. 2 is a view in perspective showing a mask and slice mounted on a holding fixture.
FIG. 3 shows a typical mask having a plurality of apertures.

Referring now to the drawings, FIG. 1 illustrates a typical semiconductor slice 11 having a plurality of pairs of contact stripes 12 and 13 mounted thereon.

2

The slice 11 is mounted on the fixture 14 of FIG. 2 and secured thereon. A mask 16 (FIG. 3), preferably made of metal and having a plurality of apertures 17, is placed over the slice 11 and positioned such that each aperture 17 encompasses a pair of contact stripes 12 and 13. As an aid in positioning a microscope, not shown, can be used.

Figures 4, 7:
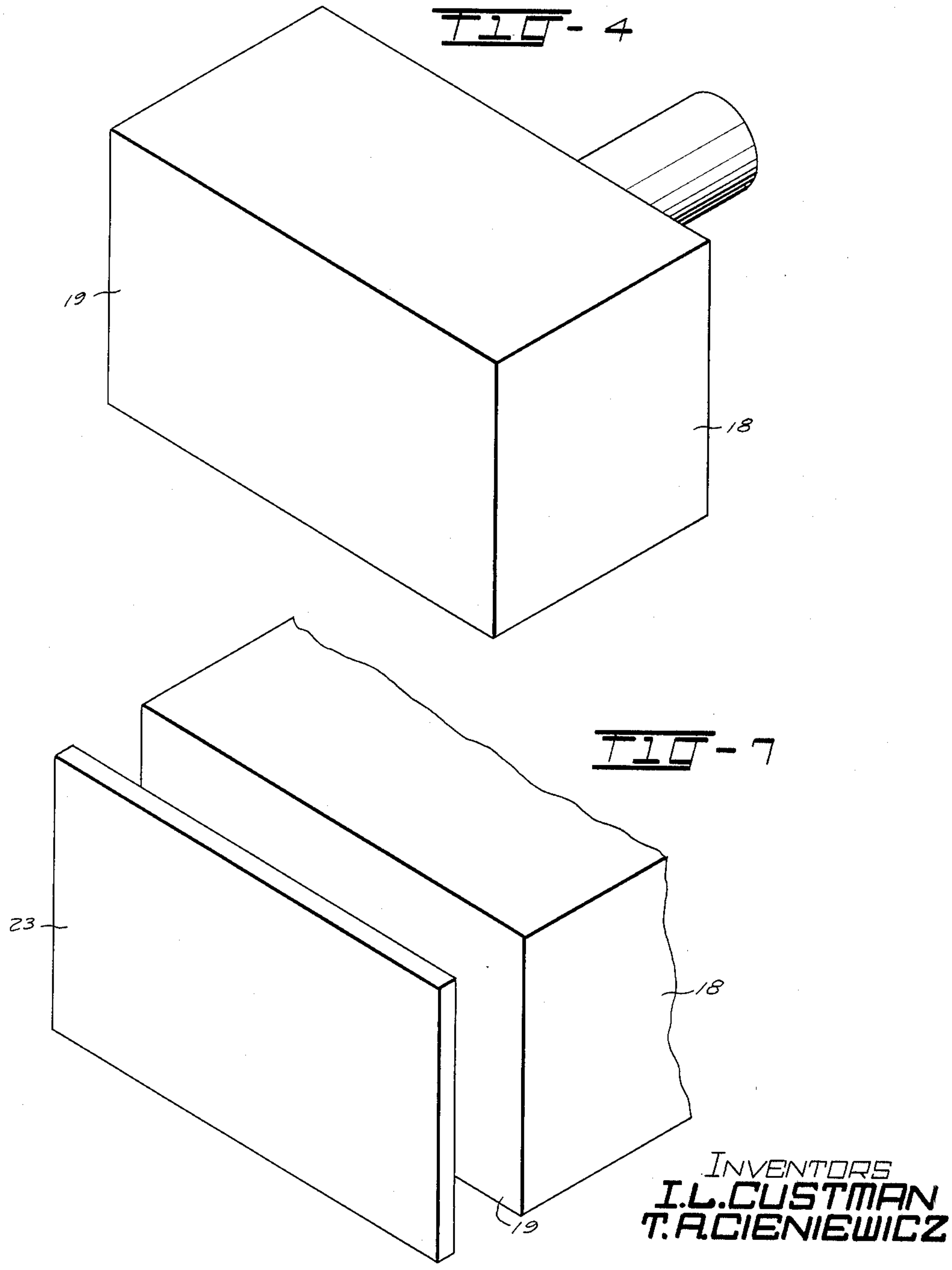
FIG. 4 is a view in perspective showing an extrusion tool.
FIG. 7 shows a modification of the extrusion tool of FIG. 4 for use with a semiconductor slice having an irregular surface; and, FIG. 8 is a front elevation view of an apparatus incorporating the invention.

FIG. 4 shows an extrusion tool 18 used for applying wax to the slice 11 surface. The tool 18 has a flat surface 19 and is adaptable for use manually or as will be described below, with the apparatus of FIG. 8.

In order to provide uniform parting or releasing of wax from the extrusion tool 18 a release agent is used. The prime property of the release agent is that it must be immiscible with wax. Water, which has this property, was found to provide the best results. Further, it was found that even more uniform releasing or parting could be obtained if another release agent such as a small piece of filter paper was used in conjunction with the water.

Figure 5:
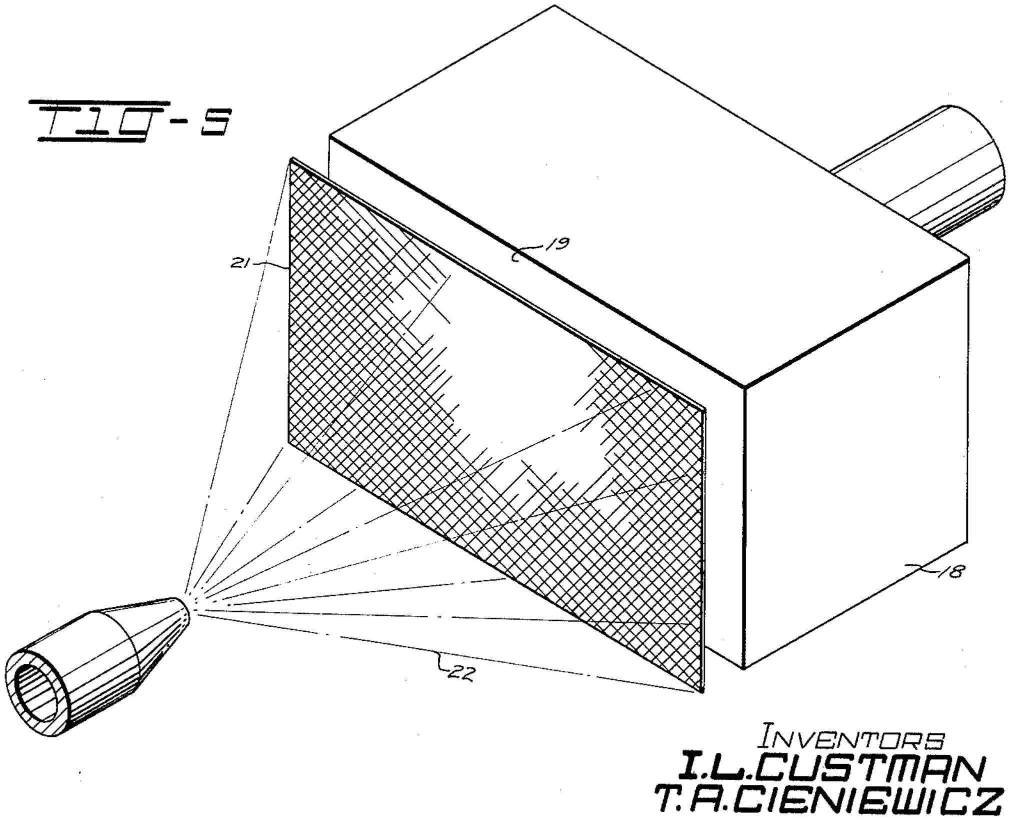
FIG. 5 shows generally the application of wax to the extrusion tool.

As illustrated in FIG. 5 the filter paper 21 is moistened in water and then placed on the flat surface 19 of the extrusion tool 18. Due to the cohesive force of the water the filter paper 21 readily adheres to the clear surface of the extrusion tool 18. Preferably distilled water, containing no ions should be used. A wax film 22 is uniformly sprayed onto the wet filter paper 21 and allowed to dry. The drying time should be such that the upper surface of the wax, i.e., the surface furthest from the filter paper 21 is stiff and the surface in contact with the filter paper is fluid. To this end, a drying time of approximately four minutes was found to provide satisfactory results.

Figure 6:
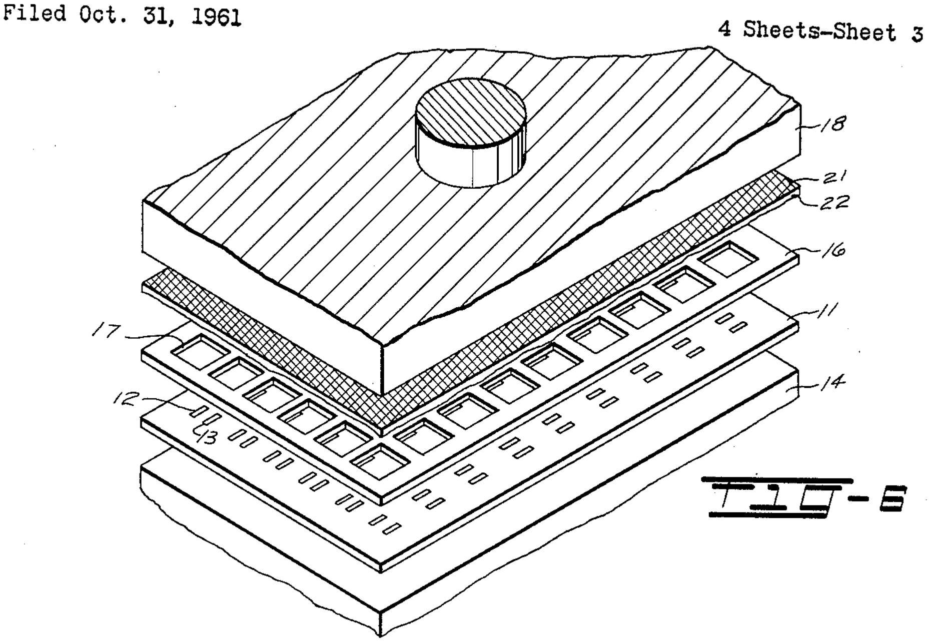
FIG. 6 illustrates the application of the wax mask to the semiconductor slice.

The extrusion tool 18 is then placed wax side down against the metal mask 16 as shown in FIG. 6. Pressure is applied to the extrusion tool 18 either manually or by the apparatus of FIG. 8. This extrudes the wax through the apertures 17 of the metal mask 16 onto the surface of the slice 11 and covers only those areas which are not to be etched. The extrusion tool 18 and mask 16 are then removed.

Subsequent to masking the slice is etched and diamond scribed, the result being a plurality of transistor wafers.

For use with irregularly surfaced slices, e.g., epitaxial slices, a flat piece of rubber 23 or other suitable resilient material is placed on the flat surface 19 of the extrusion tool 18 as shown in FIG. 7, prior to application of the wax. This assures that wax will cover all cavities and crevices in the irregularly surfaced semiconductor slice.

Figure 8:
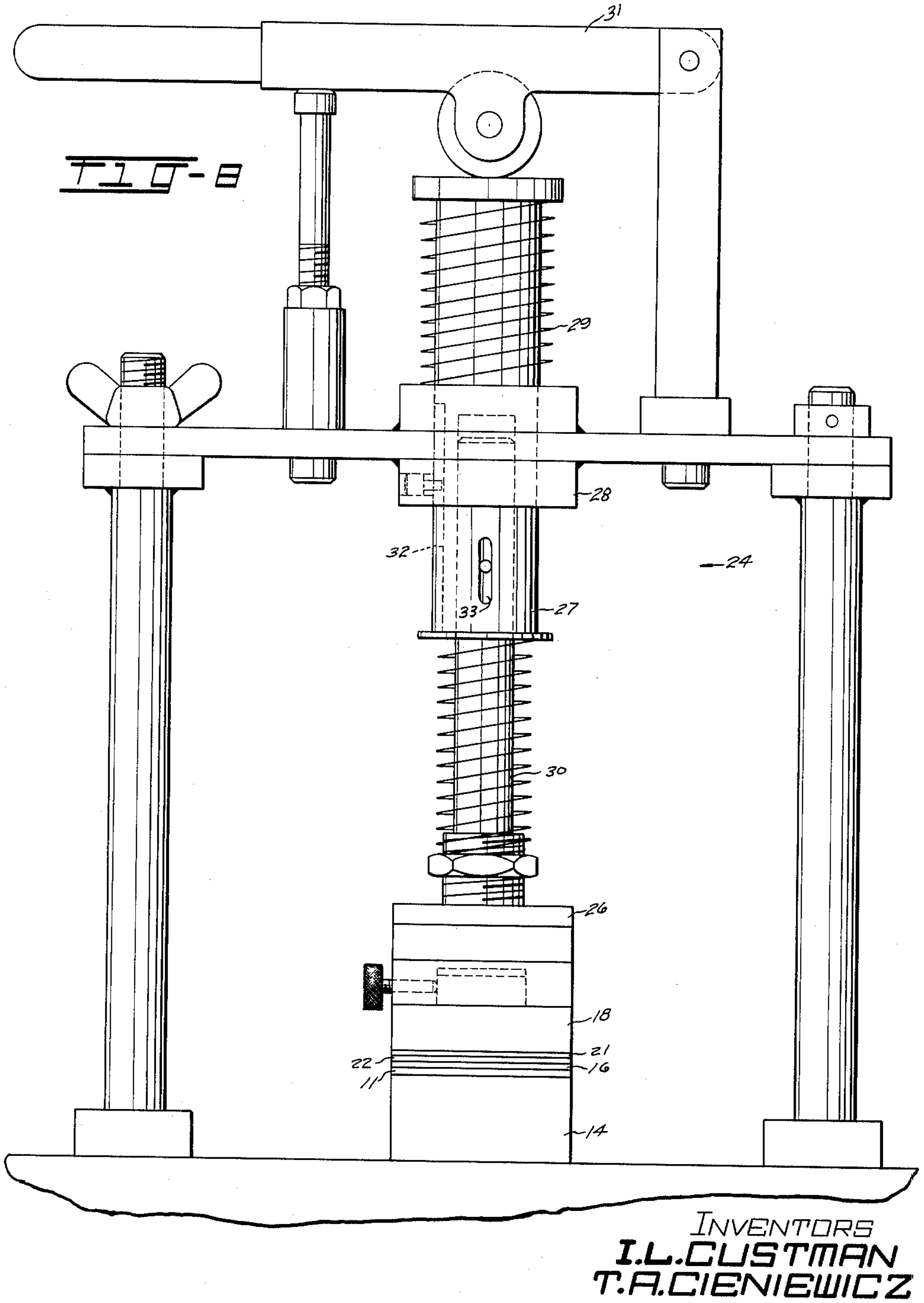

An apparatus for carrying out the invention is illustrated in FIG. 8. The apparatus shown therein includes a jig 24 with a daubing tool 18 mounted therein. The extrusion tool 18 with the release agent 21 and wax 22 applied thereon, as described above, is mounted in a spring actuated member 26 which in turn is slidably disposed within a cylindrical sleeve 27. The cylindrical sleeve 27 is supported within a support member 28 by the spring 29 and is free to move therein in a vertical direction. A pivotally supported lever 31 is used to raise and lower the member 26 and the sleeve 27. Two keyways 32 and 33 are provided to assure that no lateral movement of the member 26 and the sleeve 27 occurs during their travel.

Raising of the lever 31 releases the spring 29 to cause upward movement of the member 26 and the sleeve 27 and allow positioning of the fixture 14 with the slice 11 and mask 16 thereon. When the lever 31 is depressed, pressure is applied to the extrusion tool 18 by the combination of sleeve 27 and spring 30. Application of pressure to the extrusion tool 18 extrudes the wax 22 through the apertures of the mask 16 onto the silce 11. Since the extrusion tool 18 is constrained to move in only one direction, i.e., vertical, uniform application of the wax mask is assured.

It is to be understood that the above description and arrangements are simply illustrative of the application of the principles of the invention. Other arrangements than those proposed may be readily devised by a person skilled in the art which will embody the principles and fall within the spirit and scope of the invention.

What is claimed is:

1. The method of masking a relatively flat-surfaced semiconductive body with wax to enable selective etching thereof, which comprises the steps of:

(a) placing a mask having an array of apertures in intimate contact with the flat surface of the body, each aperture defining a region which is not to be etched;

(b) placing a wax film, having a perimeter at least coextensive with that of the array of apertures, over and in intimate contact with the mask; and (c) forcing the wax film and the body relatively together with sufficient force to extrude the wax through the mask apertures and into adhering contact with the body.

2. The method of claim 1 wherein steps (b) and (c) are accomplished by:

applying wax onto one side of a flat plate having a perimeter at least coextensive with that of the array of apertures;

moving the plate and the body relatively together to place the wax in contact with the mask; and applying sufficient force to extrude the wax through the mask apertures and into adhering contact with the body.

3. The method of claim 2 wherein a water impregnated paper sheet is placed in adhering contact with the one side of the plate before the wax is applied.

4. The method of claim 3 wherein the wax is applied in a fluid state by spraying, and is then allowed to dry prior to moving the plate and the body relatively together, for a time such that the surface of the wax in contact with the plate remains fluid, while the surface opposite thereto becomes stiff.

5. The method of claim 4 wherein a resilient pad is placed in adhering contact with the one side of the plate before the water impregnated paper sheet is placed thereon.

References Cited by the Examiner

UNITED STATES PATENTS

| | | | |
|---|---|---|---|
| 1,892,083 | 12/1932 | Sidebotham | 117—5.5 |
| 3,046,176 | 7/1962 | Bosenberg | 156—17 |

FOREIGN PATENTS

| | | |
|---|---|---|
| 61,045 | 4/1912 | Switzerland. |
| 312,953 | 4/1956 | Switzerland. |

RICHARD D. NEVIUS, *Primary Examiner.*